United States Patent
Lee et al.

(10) Patent No.: US 9,496,264 B2
(45) Date of Patent: Nov. 15, 2016

(54) STRUCTURE AND FORMATION METHOD OF FINFET DEVICE

(71) Applicant: TAIWAN SEMICONDUCTOR MANUFACTURING CO., LTD, Hsin-Chu (TW)

(72) Inventors: Kai-Hsuan Lee, Hsinchu (TW); Cheng-Yu Yang, Xihu Township, Changhua County (TW); Hsiang-Ku Shen, Hsinchu (TW); Han-Ting Tsai, Kaoshiung (TW); Yimin Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/621,814

(22) Filed: Feb. 13, 2015

(65) Prior Publication Data

US 2016/0240536 A1    Aug. 18, 2016

(51) Int. Cl.

| | |
|---|---|
| *H01L 27/12* | (2006.01) |
| *H01L 27/092* | (2006.01) |
| *H01L 29/78* | (2006.01) |
| *H01L 21/335* | (2006.01) |
| *H01L 29/207* | (2006.01) |
| *H01L 29/36* | (2006.01) |
| *H01L 29/66* | (2006.01) |
| *H01L 21/8234* | (2006.01) |
| *H01L 21/266* | (2006.01) |

(Continued)

(52) U.S. Cl.
CPC ......... *H01L 27/0924* (2013.01); *H01L 21/266* (2013.01); *H01L 21/823412* (2013.01); *H01L 21/823475* (2013.01); *H01L 29/207* (2013.01); *H01L 29/36* (2013.01); *H01L 29/66795* (2013.01); *H01L 29/7848* (2013.01); *H01L 29/161* (2013.01); *H01L 29/495* (2013.01)

(58) Field of Classification Search
CPC ............. H01L 27/092; H01L 27/0924; H01L 29/207; H01L 29/36; H01L 29/161; H01L 29/495; H01L 29/7848; H01L 29/66795; H01L 21/266; H01L 21/823412; H01L 21/823475
USPC .......... 257/192, 288, 369, 401, 412, E27.06, 257/E27.062, E27.112, E29.193, E29.255, 257/E29.345, E21.403, E21.409, E21.591, 257/E21.704; 438/197, 300, 591, 682
See application file for complete search history.

(56) References Cited

U.S. PATENT DOCUMENTS

| | | | |
|---|---|---|---|
| 8,889,552 B2* | 11/2014 | Park | ................. H01L 21/82387 257/384 |
| 2010/0219475 A1* | 9/2010 | Kronholz | ........ H01L 21/823807 257/351 |
| 2011/0027954 A1* | 2/2011 | Obradovic | ...... H01L 21/823807 438/285 |

(Continued)

*Primary Examiner* — Dao H Nguyen
(74) *Attorney, Agent, or Firm* — Birch, Stewart, Kolasch & Birch, LLP (57) ABSTRACT

Structures and formation methods of a semiconductor device structure are provided. The semiconductor device structure includes a semiconductor substrate and a first gate stack and a second gate stack over the semiconductor substrate. The semiconductor device structure also includes a first doped structure over the semiconductor substrate and adjacent to the first gate stack. The first doped structure includes a III-V compound semiconductor material and a dopant. The semiconductor device structure further includes a second doped structure over the semiconductor substrate and adjacent to the second gate stack. The second doped structure includes the III-V compound semiconductor material and the dopant. One of the first doped structure and the second doped structure is an n-type semiconductor structure, and the other one of the first doped structure and the second doped structure is a p-type semiconductor structure.

20 Claims, 10 Drawing Sheets

(51) Int. Cl.
*H01L 29/161* (2006.01)
*H01L 29/49* (2006.01)

(56) References Cited

U.S. PATENT DOCUMENTS

2012/0032275 A1* 2/2012 Haran ............... H01L 21/28518
257/401
2012/0056245 A1* 3/2012 Kang ................... H01L 21/0245
257/192
2015/0206974 A1* 7/2015 Lim .................... H01L 29/7851
257/288
2015/0311204 A1* 10/2015 Glass .............. H01L 21/823821
257/369
2015/0357329 A1* 12/2015 Lim .................... H01L 29/7848
257/369

\* cited by examiner

STRUCTURE AND FORMATION METHOD OF FINFET DEVICE

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased.

This scaling-down process generally provides benefits by increasing production efficiency and lowering associated costs. However, these advances have increased the complexity of processing and manufacturing ICs. For example, III-V compound semiconductors are potential channel materials for future CMOS devices because of their high mobility and low carrier effective mass.

It is a challenge to form reliable semiconductor devices that include III-V compound semiconductors.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1J are cross-sectional views of various stages of a process for forming a semiconductor device structure, in accordance with some embodiments. Additional operations can be provided before, during, and/or after the stages described in FIGS. 1A-1J. Some of the stages that are described can be replaced or eliminated for different embodiments. Additional features can be added in the semiconductor device structure. Some of the features described below can be replaced or eliminated for different embodiments.

Figure 1A:
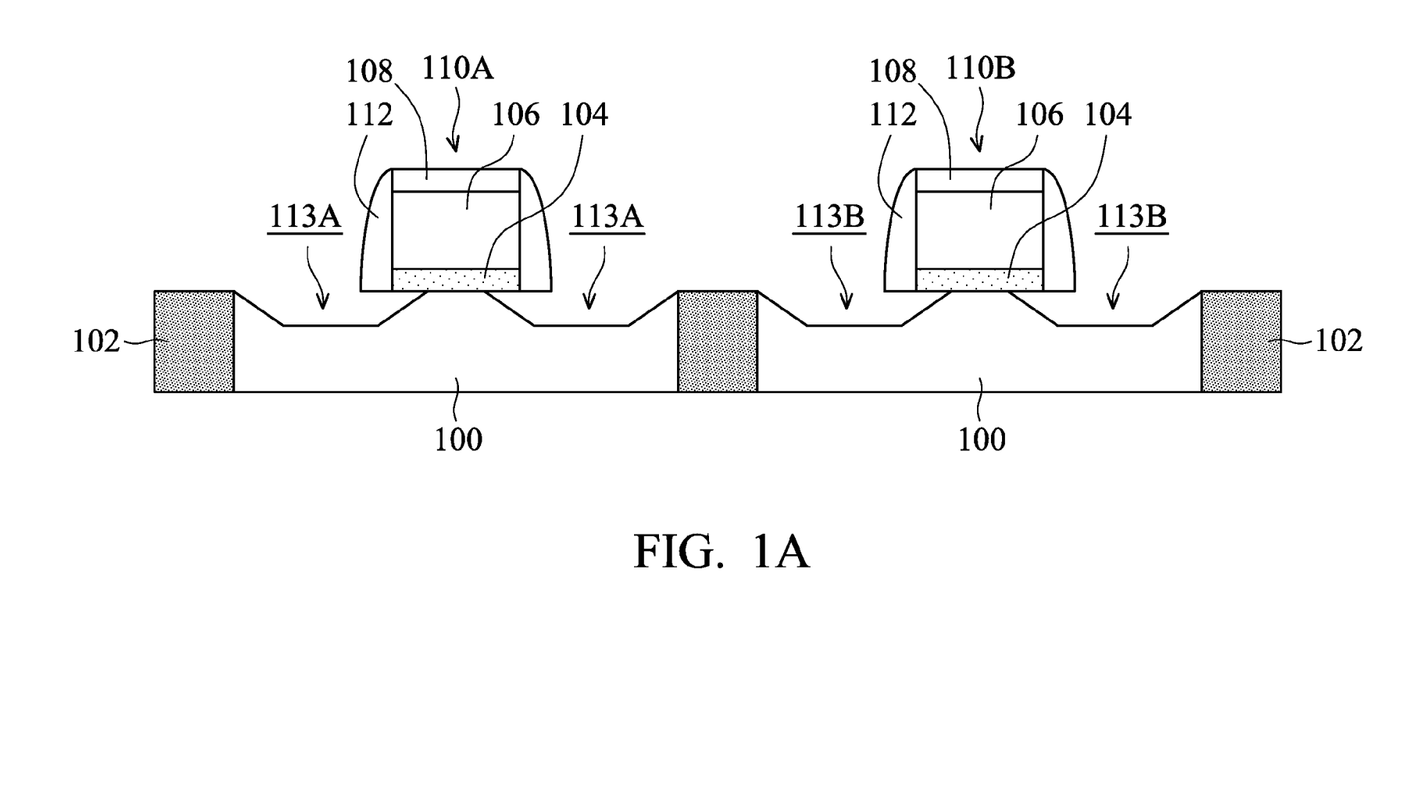
FIGS. 1A-1J are cross-sectional views of various stages of a process for forming a semiconductor device structure, in accordance with some embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or other elementary semiconductor materials such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the semiconductor substrate 100 shown in FIG. 1A is a fin structure.

As shown in FIG. 1A, isolation features 102 are formed in the semiconductor substrate 100, in accordance with some embodiments. The isolation features 102 are used to define and/or electrically isolate various device elements formed in and/or over the semiconductor substrate 100. In some embodiments, the isolation features 102 includes shallow trench isolation (STI) features, local oxidation of silicon (LOCOS) features, another suitable isolation feature, or a combination thereof. In some embodiments, the isolation features 102 are made of a dielectric material. The dielectric material may include silicon oxide, silicon nitride, silicon oxynitride, fluoride-doped silicate glass (FSG), low-K dielectric material, another suitable material, or a combination thereof.

As shown in FIG. 1A, gate stacks 110A and 110B are formed over the semiconductor substrate 100, in accordance with some embodiments. In some embodiments, each of the gate stacks 110A and 110B includes a gate dielectric layer 104, a gate electrode 106, and a hard mask 108. In some embodiments, the gate stack 110A serves as a gate stack of an NMOS device structure, and the gate stack 110B serves as a gate stack of a PMOS device structure. In some other embodiments, the gate stack 110A serves as a gate stack of a PMOS device structure, and the gate stack 110B serves as a gate stack of an NMOS device structure.

The hard mask 108 may serve as an etching mask during the formation of the gate electrodes 106. In some embodiments, the hard mask 108 is made of silicon oxide, silicon nitride, silicon oxynitride, silicon carbide, silicon carbon nitride, another suitable material, or a combination thereof. In some embodiments, the hard mask 108 has a multi-layer structure. Embodiments of the disclosure are not limited thereto. In some other embodiments, the hard mask 108 is not formed.

In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will be removed in a subsequent process. The dummy gate dielectric layer is, for example, a silicon oxide layer. Many variations and/or modifications can be made to embodiments of the disclosure. In some other embodiments, the gate dielectric layer 104 is not formed.

In some embodiments, each of the gate electrodes 106 includes polysilicon, a metal material, another suitable conductive material, or a combination thereof. In some embodiments, the gate electrode 106 is a dummy gate electrode layer and will be replaced with another conductive material, such as a metal material. The dummy gate electrode layer is made of, for example, polysilicon.

In some embodiments, a gate dielectric material layer, a gate electrode layer, and a hard mask layer are deposited over the semiconductor substrate 100. Each of the gate dielectric material layer, the gate electrode layer, and the hard mask layer may be deposited using a chemical vapor deposition (CVD) process, an atomic layer deposition (ALD) process, a physical vapor deposition (PVD) process, another applicable process, or a combination thereof. Afterwards, a photolithography process and an etching process are performed to pattern the hard mask layer so as to form the hard mask 108. The gate dielectric material layer and the gate electrode layer are etched afterwards through openings defined by the hard mask 108. As a result, multiple gate stacks including the gate stacks 110A and 110B are formed.

In some embodiments, spacer elements 112 are formed over sidewalls of the gate stacks 110A and 110B, as shown in FIG. 1A. The spacer elements 112 may be made of silicon nitride, silicon oxynitride, silicon carbide, silicon carbon nitride, another suitable material, or a combination thereof. In some embodiments, a spacer material layer is deposited over the semiconductor substrate 100 and the gate stacks 110A and 110B. Afterwards, an anisotropic etching process is performed to partially remove the spacer material layer. As a result, the remaining portions of the spacer material layer form the spacer elements 112.

As shown in FIG. 1A, recesses 113A and 113B are formed in the semiconductor substrate 100, in accordance with some embodiments. The recesses 113A are adjacent to the gate stack 110A, and the recesses 113B are adjacent to the gate stack 110B. In some embodiments, one or more etching processes are used to partially remove the semiconductor substrate 100 so as to form the recesses 113A and 113B. The spacer elements 112 may be used to block the etchants during the formation of the recesses 113A and 113B. Therefore, the profiles of the recesses 113A and 113B are controlled. In some embodiments, each of the recesses 113A and 113B laterally extends under the spacer element 112 and further extends under the gate stack 110A or 110B.

Figure 1B:
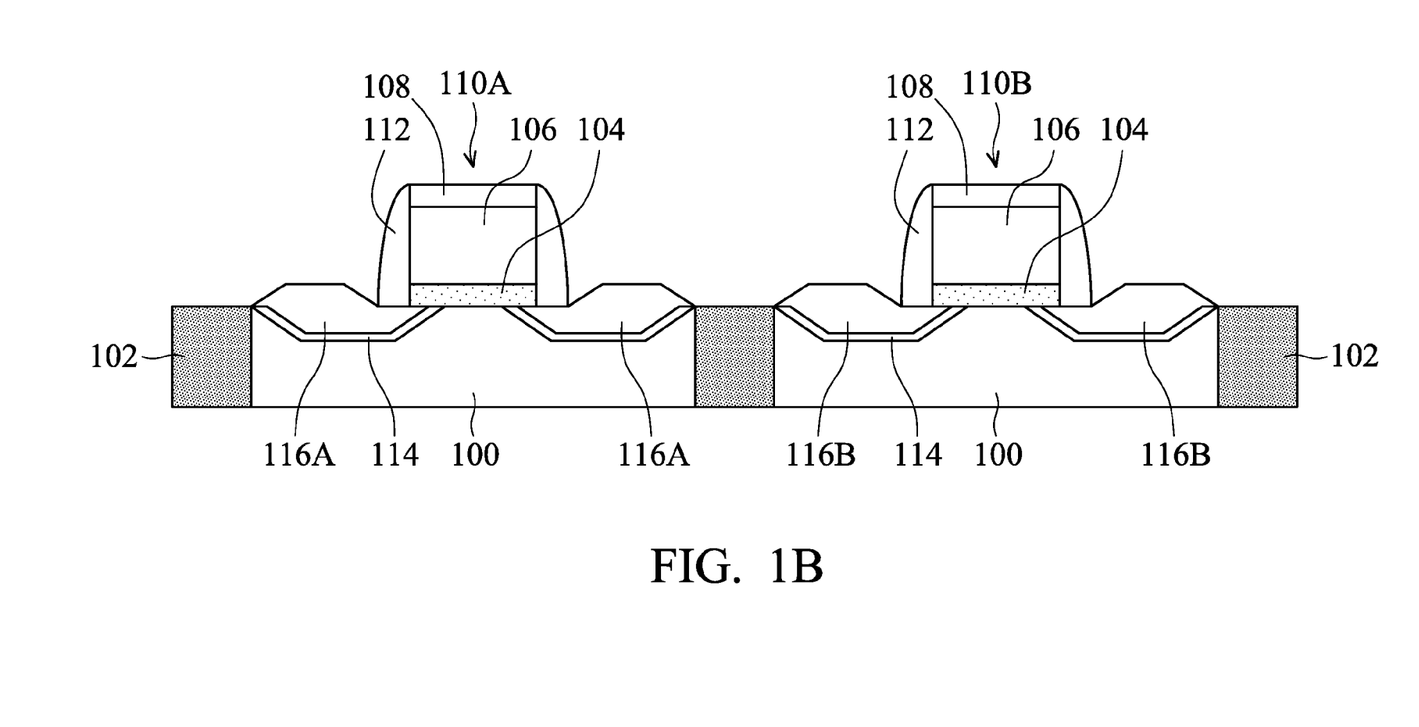

As shown in FIG. 1B, a buffer layer 114 is formed over bottoms and sidewalls of the recesses 113A and 113B, in accordance with some embodiments. Afterwards, doped structures 116A and 116B are formed over the buffer layer 114 to respectively fill the recesses 113A and 113B, as shown in FIG. 1B in accordance with some embodiments.

The buffer layer 114 may have a lattice constant that is between the lattice constant of the semiconductor substrate 100 and the lattice constant of the doped structures 116A and 116B. The transition of lattice constants is therefore less abrupt. The reliability of the device structure may be improved. In some embodiments, the buffer layer 114 is made of InGaAs, GaAs, InP, InAs, InSb, InAlAs, GaSb, AlSb, AlAs, AlP, GaP, another suitable material, or a combination thereof. In some embodiments, the buffer layer 114 is formed using a selective epitaxial growth (SEG) process, a CVD process (e.g., a vapor-phase epitaxy (VPE) process, a low-pressure chemical vapor deposition (LPCVD) process, or an ultra-high vacuum CVD (UHV-CVD) process), a molecular beam epitaxy process, another applicable process, or a combination thereof.

In some embodiments, the buffer layer 114 has a uniform composition. In some other embodiments, the compositions of the buffer layer 114 are not uniform. In some embodiments, the compositions of the buffer layer 114 gradually change along a direction from the bottom (near the semiconductor substrate 100) to the top (neat the doped structures 116A or 116B) of the buffer layer 114. In some embodiments, the buffer layer 114 includes In, Ga, and As. In some embodiments, the concentration of In gradually increases to about 0.8 along a direction from the bottom to the top of the buffer layer 114. In some embodiments, due to the variations in compositions, the lattice constants of the gradually increase along a direction from the bottom to the top of the buffer layer 114.

Afterwards, the doped structures 116A and 116B are formed over the buffer layer 114, as shown in FIG. 1B. The doped structures 116A and 116B may serve as source/drain structures of device structures. In some embodiments, the doped structures 116A and 116B are simultaneously formed in the same epitaxial growth process. The conductivity type of the doped structures 116A are the same as the conductivity type of the doped structures 116B. In some embodiments, the doped structures 116A serve as n-type doped source and drain structures. In some other embodiments, the doped structures 116A serve as p-type doped source and drain structures.

In some embodiments, both of the doped structures 116A and 116B include InGaAs, GaAs, InP, InAs, InSb, InAlAs, GaSb, AlSb, AlAs, AlP, GaP, MoS, another suitable material, or a combination thereof. In some embodiments, the doped structures 116A and 116B are formed using an SEG process, a CVD process, a molecular beam epitaxy process, another applicable process, or a combination thereof. In some embodiments, the doped structures 116A and 116B are formed in-situ in the process chamber where the buffer layer 114 is formed.

In some embodiments, the doped structures 116A and 116B include a III-V compound semiconductor material and are n-type doped. The III-V compound semiconductor material includes, for example, InGaAs, InAs, or MoS. In some embodiments, the dopant in the doped structures 116A and 116B includes Si, Ge, Sn, Pb, Se, Te, another suitable dopant, or a combination thereof. In some embodiments, the concentration of the dopant in the doped structures 116A or 116B is in a range from about $10^{18}$ atoms/cm$^3$ to about $10^{21}$ atoms/cm$^3$. The dopant may be substitutional and/or interstitial.

In some other embodiments, the doped structures 116A and 116B include a III-V compound semiconductor material and are p-type doped. The III-V compound semiconductor material includes, for example, GaSb or InSb. In some embodiments, the dopant in the doped structures 116A and 116B includes C, Be, Mg, Zn, another suitable dopant, or a combination thereof. In some embodiments, the concentration of the dopant in the doped structures 116A or 116B is in a range from about $10^{18}$ atoms/cm³ to about $10^{21}$ atoms/cm³. The dopant may be substitutional and/or interstitial.

In some embodiments, the doped structures 116A and 116B are doped in-situ during the growth of the III-V compound semiconductor material. In some other embodiments, an additional implantation process is performed on the III-V compound semiconductor material that are epitaxially grown in the recesses 113A and 113B to form the doped structures 116A and 116B. In some embodiments, energy used in the ion implantation process is fine-tuned to control the implantation depth of the dopant. In some embodiments, the implantation depth of the dopant is in a range from about 10 nm to about 20 nm.

Many variations and/or modifications can be made to embodiments of the disclosure. In some embodiments, the buffer layer 114 is not formed. In some embodiments, the doped structures 116A and 116B are directly formed on the bottoms and the sidewalls of the recesses 113A and 113B.

Figure 1C:
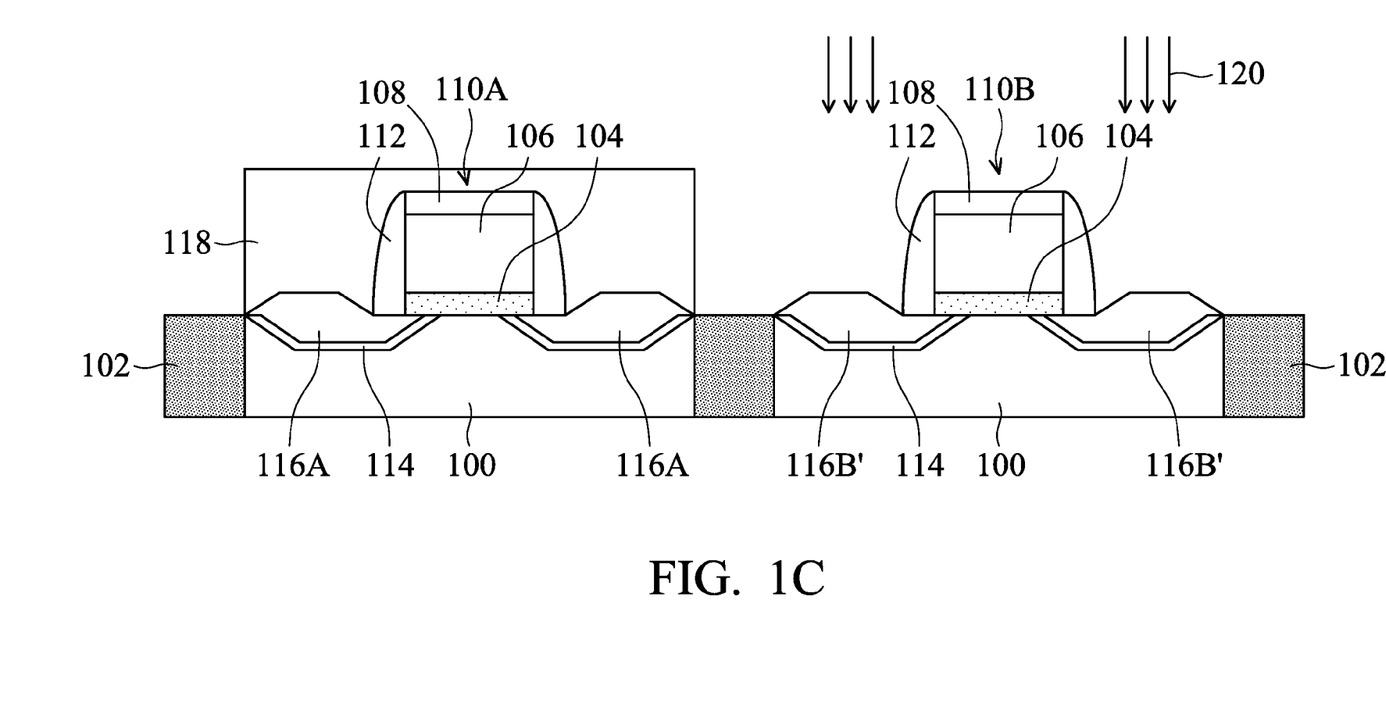

As shown in FIG. 1C, a mask layer 118 is formed to cover the doped structures 116A and the gate stack 110A, in accordance with some embodiments. The mask layer 118 has an opening that exposes the doped structures 116B and the gate stack 110B. In some embodiments, a doping process 120 is performed on the doped structures 116B to dope the doped structures 116B with a second dopant so as to form doped structures 116B'. The second dopant may be substitutional and/or interstitial.

In some embodiments, the doped structures 116B' have a conductivity type different from that of the doped structures 116A or the doped structures 116B. During the doping process 120, the mask layer 118 protects the doped structures 116A thereunder and prevents the second dopant from entering the doped structures 116A. Therefore, the conductivity type of the doped structures 116A may remain. In some embodiments, the mask layer 118 is a patterned photoresist layer.

In some embodiments, the second dopant used in the doping process 120 and the dopant originally in the doped structures 116B (or the dopant in the doped structures 116A) are the same. In some embodiments where the doped structures 116A are n-type doped, the second dopant used in the doping process 120 includes Si, Ge, Sn, Pb, another suitable dopant, or a combination thereof. Studies show that if the amount of Si, Ge, Sn, or Pb is greater than a specific value, the conductivity type of the doped structures may be changed.

In some embodiments, after introducing the second dopant of the doping process 120, the concentration of the dopant in the doped structures 116B' is greater than that in the doped structures 116A. The concentration of the dopant in the doped structures 116B' may be in a range from about $10^{19}$ atoms/cm³ to about $10^{22}$ atoms/cm³. In these cases, even if both of the doped structures 116A and 116B' are doped with Si, Ge, Sn, or Pb, the conductivity type of the doped structures 116B' is changed to p-type. Meanwhile, the conductivity type of the doped structures 116A remains n-type. In some embodiments, by using the doping process 120, n-type S/D structures (the doped structures 116A) and p-type S/D structures are formed with the assistance of only one mask (the mask layer 118). Therefore, fabrication cost and fabrication time are significantly reduced.

In some embodiments where the doped structures 116A are p-type doped, the second dopant used in the doping process 120 includes C, Be, another suitable dopant, or a combination thereof. In some embodiments, after introducing the second dopant of the doping process 120, the concentration of the dopant in the doped structures 116B' is greater than that in the doped structures 116A. The concentration of the dopant in the doped structures 116B' may be in a range from about $10^{19}$ atoms/cm³ to about $10^{22}$ atoms/cm³. In these cases, even if both the doped structures 116A and 116B' are doped with C or Be, the conductivity type of the doped structures 116B' is changed to n-type. Meanwhile, the conductivity type of the doped structures 116A remains p-type. Similarly, by using the doping process 120, p-type S/D structures (the doped structures 116A) and n-type S/D structures (the doped structures 116B') are formed with the assistance of only one mask (the mask layer 118). Therefore, fabrication cost and fabrication time are significantly reduced.

Many variations and/or modifications can be made to embodiments of the disclosure. In some other embodiments, the second dopant used in the doping process 120 and the dopant originally in the doped structures 116B (or the dopant in the doped structures 116A) are different from each other. In some embodiments, the doped structures 116A and the doped structures 116B are n-type doped with one or more dopants including Se, Te, another suitable dopant, or a combination thereof. In some embodiments, the second dopant used in the doping process 120 includes Si, Ge, Sn, Pb, another suitable dopant, or a combination thereof. In some embodiments, after introducing a sufficient amount of the second dopant, the conductivity type of the doped structures 116B' may be changed to p-type even if the doped structures 116B' also include Se or Te. In these cases, the concentration of the second dopant in the doped structures 116B' is greater than the concentration of the second dopant in the doped structures 116A since the doped structures 116A are prevented from being doped with the second dopant by the mask layer 118.

In some other embodiments, the doped structures 116A and the doped structures 116B are p-type doped with one or more dopants including Mg, Zn, another suitable dopant, or a combination thereof. In some embodiments, the second dopant used in the doping process 120 includes C, Be, another suitable dopant, or a combination thereof. In some embodiments, after introducing a sufficient amount of the second dopant, the conductivity type of the doped structures 116B' may be changed to n-type even if the doped structures 116B' also include Mg or Zn.

Figure 1D:
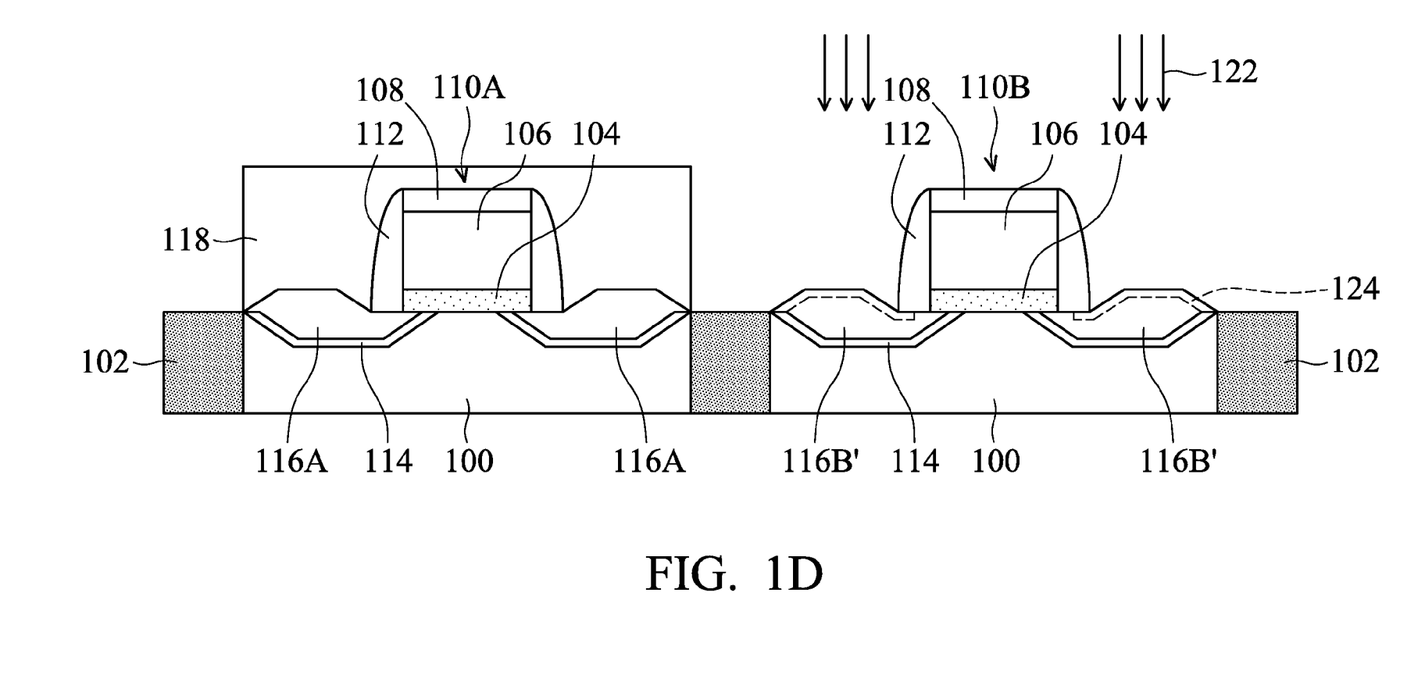

As shown in FIG. 1D, a doping process 122 is performed on the doped structures 116B' to further dope upper portions 124 of the doped structures 116B' with a third dopant, in accordance with some embodiments. The third dopant may be used to reduce the resistance of the doped structures 116B'. Therefore, electrical connection between the doped structures 116B' and conductive contacts, which will be formed on the doped structures 116B', may be improved. The third dopant may be substitutional and/or interstitial.

In some embodiments, the third dopant includes Al, Zn, Cd, Co, Be, C, Zn, another suitable dopant, or a combination thereof. In some embodiments where the doped structures 116B' have p-type conductivity, the third dopant includes Al, Zn, Cd, Co, another suitable dopant, or a combination thereof. In some embodiments where the doped structures 116B' have n-type conductivity, the third dopant includes Be, C, Zn, another suitable dopant, or a combination thereof. In some embodiments, the concentration of the third dopant in the upper portions 124 is in a range from about $10^{16}$ atoms/cm³ to about $10^{18}$ atoms/cm³.

In some embodiments, the doping process 122 is performed using an ion implantation process. In some embodiments, energy used in the ion implantation process is fine-tuned to control the implantation depth of the third dopant.

In some embodiments, the implantation depth of the third dopant is in a range from about 1 nm to about 10 nm. The depth of each of the upper portions 124 of the doped structures 116B' may be in a range from about 1 nm to about 10 nm.

Many variations and/or modifications can be made to embodiments of the disclosure. In some other embodiments, the doping process 122 is not performed to dope the upper portions 124 of the doped structures 116B'. In some other embodiments, another ion implantation process is performed to dope upper portions of the doped structures 116A to improve the conductivity of the doped structures 116A. In these cases, the mask layer 118 may be replaced with another mask layer which covers the doped structures 116B' and has one or more openings exposing the doped structures 116A.

Figure 1E:
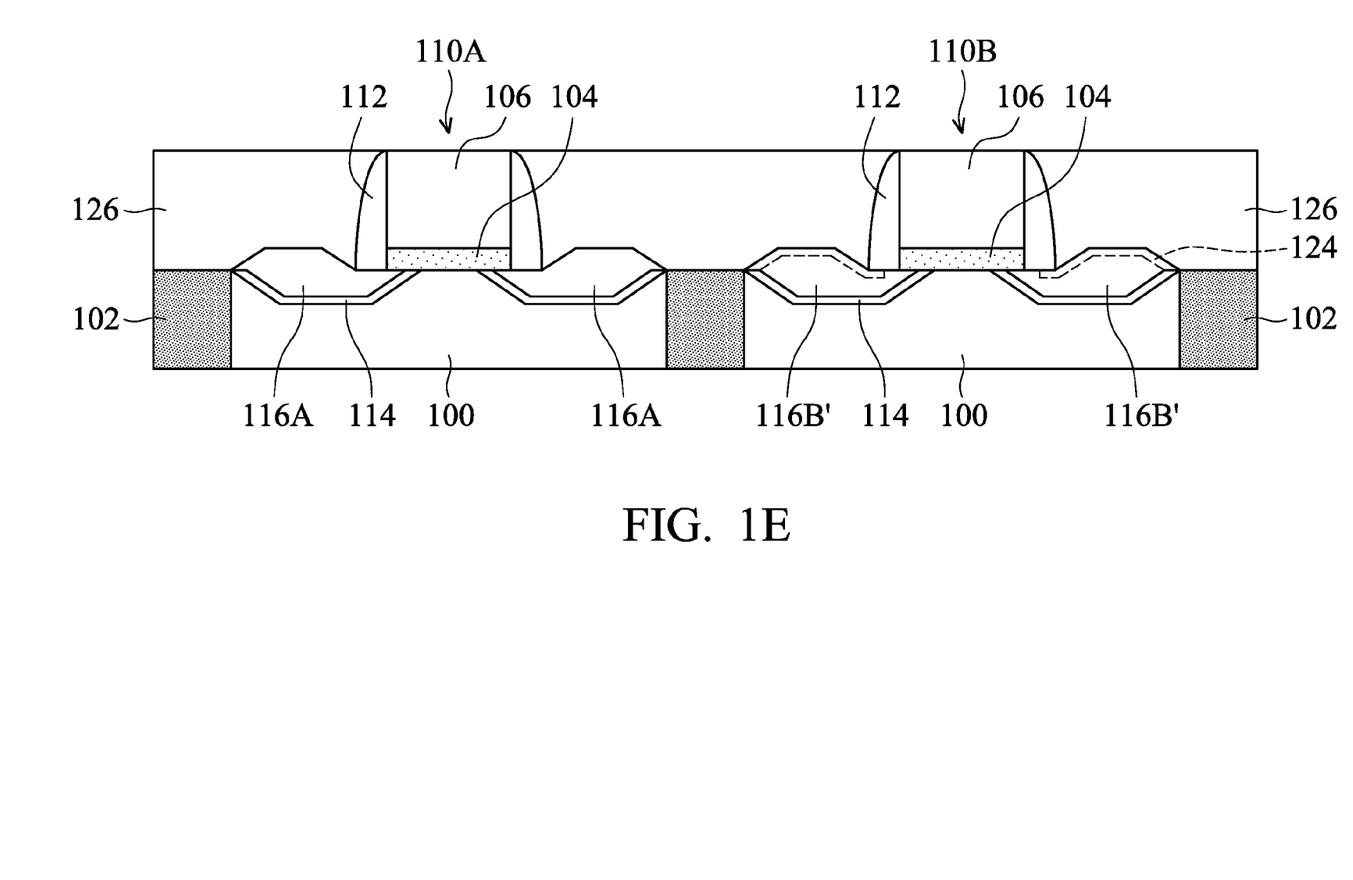

After the mask layer 118 is removed, a dielectric layer 126 is deposited over the isolation features 102, the doped structures 116A and 116B, and the gate stacks 110A and 110B, as shown in FIG. 1E in accordance with some embodiments. A planarization process may be performed afterwards to thin the dielectric layer 126 and provide the dielectric layer 126 with a substantially planar top surface. The planarization process may include a chemical mechanical polishing (CMP) process, a grinding process, an etching process, another applicable process, or a combination thereof. In some embodiments, the hard mask 108 is also removed during the planarization process to expose the gate electrodes 106.

The dielectric layer 126 may serve as an inter-metal dielectric (IMD) layer. In some embodiments, the dielectric layer 126 is made of a low-k dielectric material. The low-k dielectric material has a dielectric constant smaller than that of silicon dioxide. For example, the low-k dielectric material has a dielectric constant in a range from about 1.2 to about 3.5. As the density of semiconductor devices increases and the size of circuit elements becomes smaller, the resistance capacitance (RC) delay time increasingly dominates circuit performance. Using a low-k dielectric material as the dielectric layer 126 is helpful for reducing the RC delay.

In some embodiments, the dielectric layer 126 includes a spin-on inorganic dielectric, a spin-on organic dielectric, a porous dielectric material, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 126 includes a material including Si, C, O, or H. For example, the dielectric layer 126 includes $SiO_2$, SiOC, SiON, SiCOH, SiOCN, or a combination thereof. In some embodiments, the dielectric layer 126 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 126 includes fluorine-doped silicate glass (FSG) such as fluorine-doped —(O—Si(CH$_3$)$_2$—O)—. In some embodiments, the dielectric layer 126 is deposited using a CVD process, a spin-on process, a spray coating process, another applicable process, or a combination thereof.

Figure 1F:
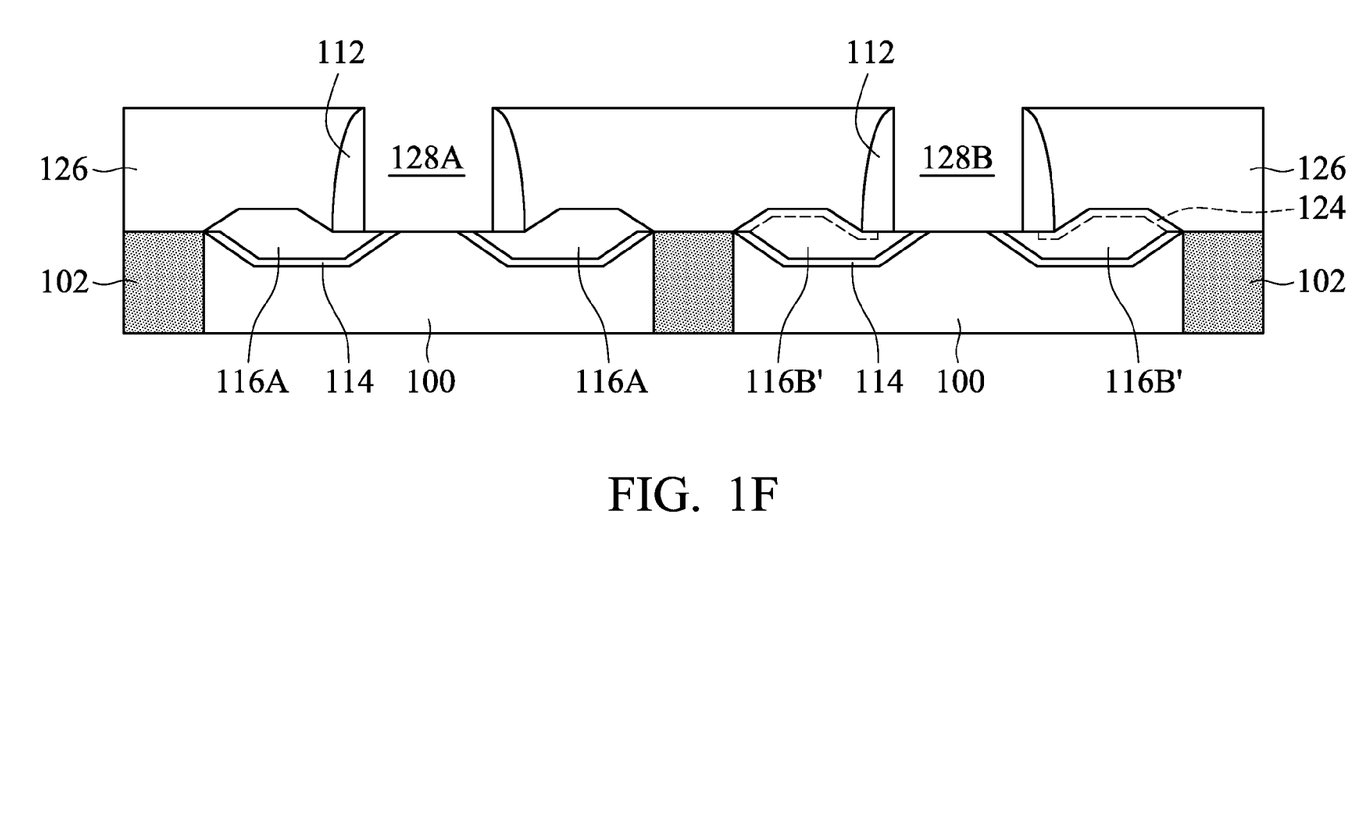

In some embodiments, the gate electrodes 106 are dummy gate electrodes and are replaced with metal gate electrodes. As shown in FIG. 1F, the gate electrodes 106 and the gate dielectric layer 104 are removed to form recesses 128A and 128B that are between the spacer elements 112, in accordance with some embodiments. One or more etching processes may be used to form the recesses 128.

Figure 1G:
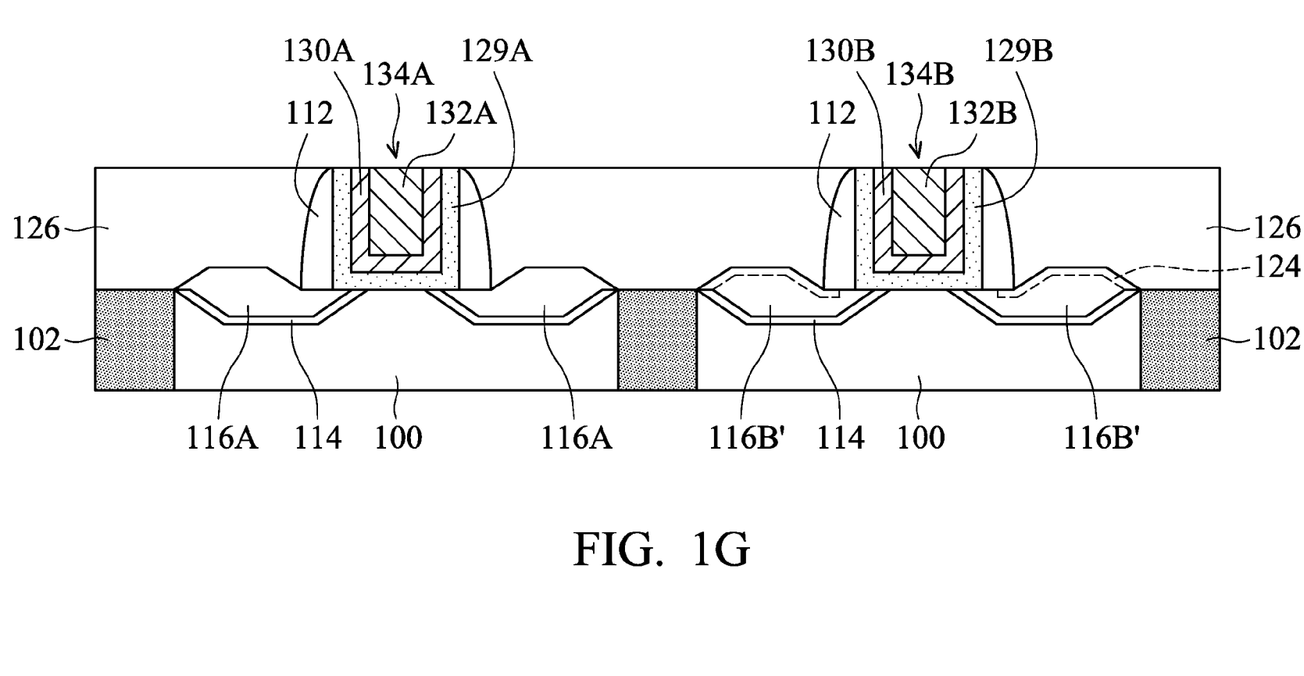

As shown in FIG. 1G, metal gate stacks 134A and 134B are respectively formed in the recesses 128A and 128B, in accordance with some embodiments. The metal gate stack 134A includes a gate dielectric layer 129A, a work function layer 130A, and a metal filling layer 132A. The metal gate stack 134B includes a gate dielectric layer 129B, a work function layer 130B, and a metal filling layer 132B.

In some embodiments, the gate dielectric layer 129A and 129B are high-k dielectric layers. In some embodiments, the gate dielectric layer 129A and 129B are patterned from the same gate dielectric layer. In some other embodiments, the gate dielectric layer 129A and 129B are formed separately in different processes. The high-k dielectric layers may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer dielectric layer 129A and 129B are deposited using an ALD process or another applicable process.

The work function layers 130A and 130B are used to provide desired work function for transistors to enhance device performance including improved threshold voltage. In some embodiments, the work function layer 130A is an n-type metal layer capable of providing a work function value suitable for the device, such as equal to or less than about 4.5 eV. In some embodiments, the work function layer 130B is a p-type metal layer capable of providing a work function value suitable for the device, such as equal to or greater than about 4.8 eV. In some other embodiments, the work function layer 130A is a p-type metal layer, and the work function layer 130B is an n-type metal layer.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 130A and 130B may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combination thereof. The thickness and/or the compositions of the work function layer 130A and 130B may be tuned to adjust the work function level. For example, a titanium nitride layer may be used as a p-type metal layer or an n-type metal layer, depending on the thickness and/or the compositions of the titanium nitride layer.

In some embodiments, the metal filling layers 132A and 132B are made of aluminum, tungsten, copper, another suitable material, or a combination thereof. The formation of the metal gate stacks 132A and 132B may involve multiple deposition processes, planarization processes, and patterning processes.

Figure 1H:
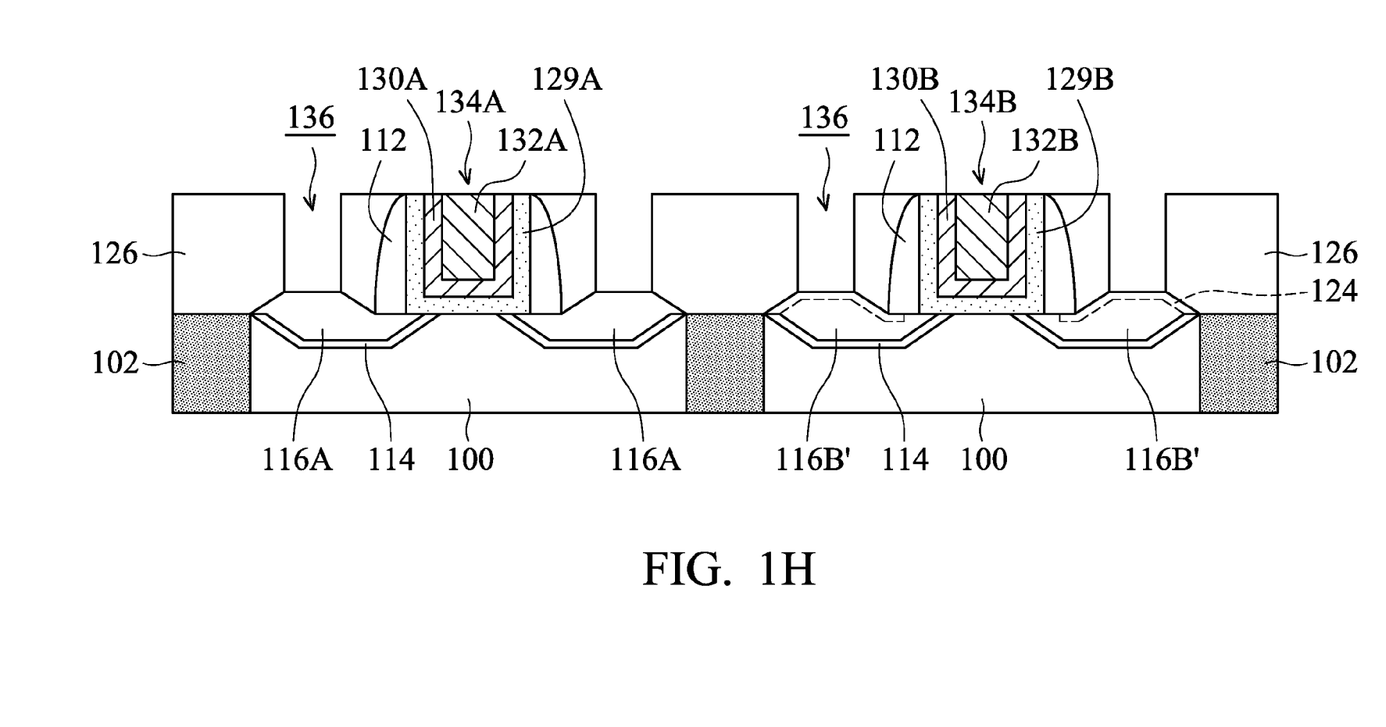

As shown in FIG. 1H, contact openings 136 are formed in the dielectric layer 126 to expose the doped structures 116A and 116B', in accordance with some embodiments. In some embodiments, one or more photolithography processes and one or more etching processes are used to form the contact openings 136.

Figure 1I:
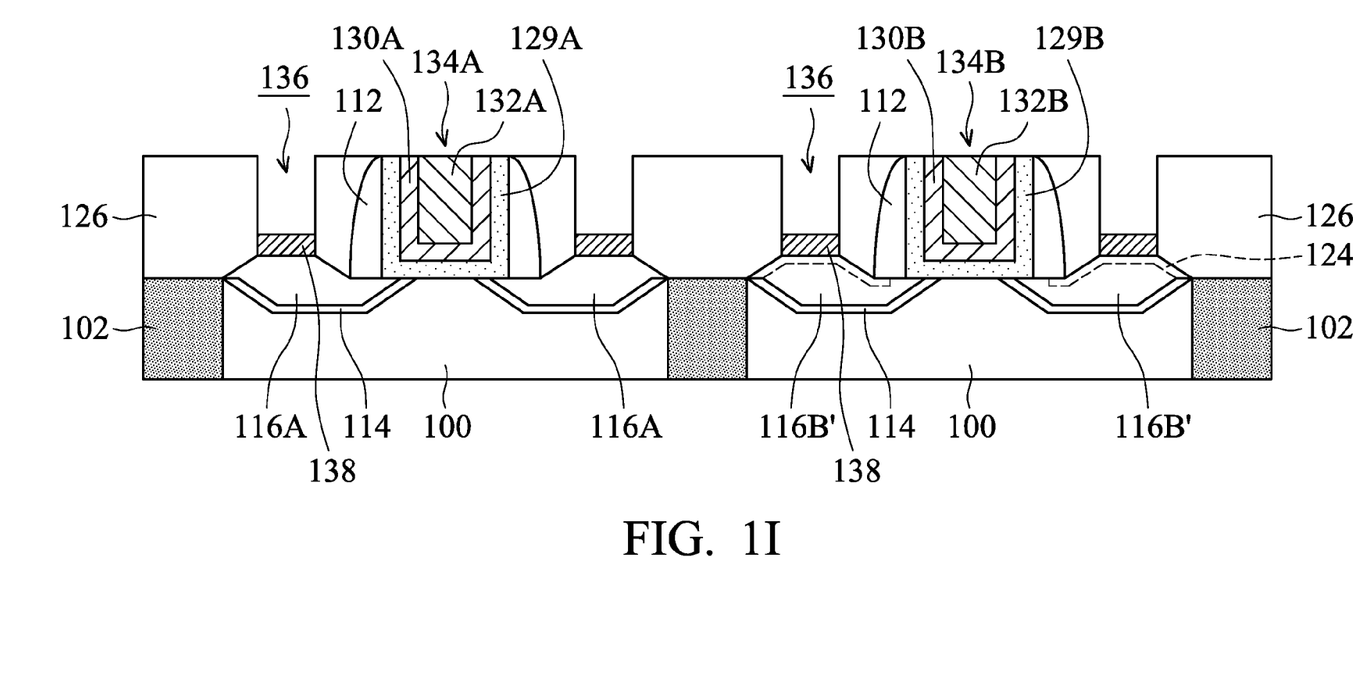

As shown in FIG. 1I, contact elements 138 are formed on the doped structures 116A and 116B that are exposed by the contact openings 136, in accordance with some embodiments. The contact elements 138 may be used to protect the doped structures 116A and 116B thereunder and to improve electrical connections between the doped structures 116A and 116B and conductive contacts that will be formed thereon later. In some embodiments, the contact elements 138 include a metal material. In some embodiments, the contact elements 138 include a refractory metal material. The contact elements 138 may therefore have a better thermal stability. The refractory metal material may include Nb, Mo, Ta, W, Rh, another suitable material, or a combination thereof. The formation method of the contact elements 138 may include a PVD process, a CVD process, another applicable process, or a combination thereof.

Figure 1J:
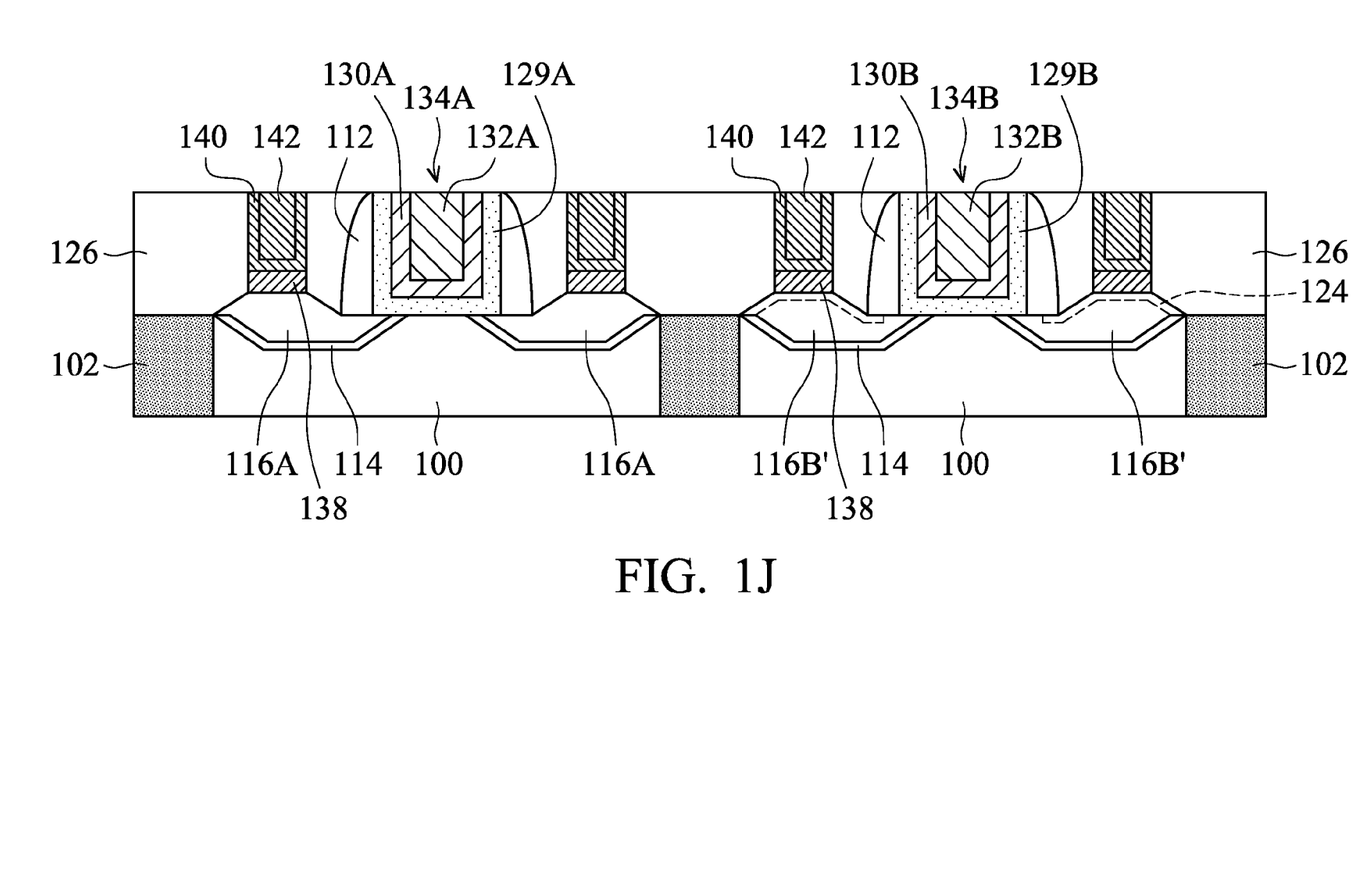

As shown in FIG. 1J, a barrier layer 140 is deposited over the contact elements 138 and over sidewalls of the contact openings 136, and conductive contacts 142 are formed to fill the contact openings 136, in accordance with some embodiments. The contact elements 138 may protect the doped structures 116A and 116B thereunder and improve electrical connections between the doped structures 116A and 116B and conductive contacts 142. The contact elements 138 may have a better thermal stability. The reliability and performance of the semiconductor device structure are therefore improved.

The barrier layer 140 may be used to protect the dielectric layer 126 from diffusion of a metal material from the conductive contacts 142. In some embodiments, the barrier layer 140 is made of titanium nitride, tantalum nitride, titanium, tungsten nitride, another suitable material, or a combination thereof. In some embodiments, the barrier layer 140 is deposited using a PVD process, a CVD process, an ALD process, an electroless plating process, another applicable process, or a combination thereof.

In some embodiments, the conductive contacts 142 is made of copper, cobalt, aluminum, tungsten, titanium, nickel, gold, platinum, another suitable conductive material, or a combination thereof. In some embodiments, the conductive contacts 142 is deposited using an electrochemical plating process, an electroless plating process, a PVD process, a CVD process, a spin-on process, another applicable process, or a combination thereof. In some embodiments, a planarization process is used to remove conductive materials formed outside of the contact openings 136.

Embodiments of the disclosure form CMOS device structure including III-V compound semiconductor source and drain structures. Multiple III-V compound semiconductor source and drain structures are formed with a first conductivity type, such as n-type. Some of the III-V compound semiconductor source and drain structures are then further doped to have a second conductivity type, such as p-type. Fabrication time and fabrication cost are significantly reduced. Contact elements are formed over the III-V compound semiconductor source and drain structures to improve electrical connections between the III-V compound semiconductor source and drain structures and conductive contacts which are then formed. The contact elements include one or more refractory metal material with a better thermal stability. The reliability and performance of the semiconductor device structure are therefore improved.

In accordance with some embodiments, a semiconductor device structure is provided. The semiconductor device structure includes a semiconductor substrate and a first gate stack and a second gate stack over the semiconductor substrate. The semiconductor device structure also includes a first doped structure over the semiconductor substrate and adjacent to the first gate stack. The first doped structure includes a III-V compound semiconductor material and a dopant. The semiconductor device structure further includes a second doped structure over the semiconductor substrate and adjacent to the second gate stack. The second doped structure includes the III-V compound semiconductor material and the dopant. One of the first doped structure and the second doped structure is an n-type semiconductor structure, and the other one of the first doped structure and the second doped structure is a p-type semiconductor structure.

In accordance with some embodiments, a semiconductor device structure is provided. The semiconductor device structure includes a semiconductor substrate and a first gate stack and a second gate stack over the semiconductor substrate. The semiconductor device structure also includes an n-type doped structure over the semiconductor substrate and adjacent to the first gate stack. The n-type doped structure includes a III-V compound semiconductor material and a dopant. The semiconductor device structure further includes a p-type doped structure over the semiconductor substrate and adjacent to the second gate stack. The p-type doped structure includes the III-V compound semiconductor material and the dopant. A concentration of the dopant in the p-type doped structure is greater than a concentration of the dopant in the n-type doped structure.

In accordance with some embodiments, a method for forming a semiconductor device structure is provided. The method includes forming a first gate stack and a second gate stack over a semiconductor substrate and forming a first recess and a second recess in the semiconductor substrate. The first recess is adjacent to the first gate stack, and the second recess is adjacent to the second gate stack. The method also includes forming a III-V compound semiconductor material in the first recess and the second recess to form a first doped structure in the first recess and a second doped structure in the second recess. The III-V compound semiconductor material includes a dopant. The method further includes doping the second doped structure with a second dopant such that the first doped structure and the second doped structure have different conductivity types.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
   a semiconductor substrate;
   a first gate stack and a second gate stack over the semiconductor substrate;
   a first doped structure over the semiconductor substrate and adjacent to the first gate stack, wherein the first doped structure comprises a III-V compound semiconductor material and a dopant; and a second doped structure over the semiconductor substrate and adjacent to the second gate stack, wherein the second doped structure comprises the III-V compound semiconductor material and the dopant, one of the first doped structure and the second doped structure is an n-type semiconductor structure, and the other one of the first doped structure and the second doped structure is a p-type semiconductor structure.

2. The semiconductor device structure as claimed in claim 1, wherein the dopant comprises Si, Ge, Sn, Pb, Se, or Te.

3. The semiconductor device structure as claimed in claim 1, wherein a concentration of the dopant in the second doped structure is greater than a concentration of the dopant in the first doped structure, and the dopant comprises Si, Ge, Sn, or Pb.

4. The semiconductor device structure as claimed in claim 1, wherein the second doped structure further comprises a second dopant, and a concentration of the second dopant in the second doped structure is greater than a concentration of the second dopant in the first doped structure.

5. The semiconductor device structure as claimed in claim 4, wherein the dopant comprises Se or Te, and the second dopant comprises Si, Ge, Sn, or Pb.

6. The semiconductor device structure as claimed in claim 1, wherein the dopant comprises C, Be, Mg, or Zn.

7. The semiconductor device structure as claimed in claim 1, wherein a concentration of the dopant in the second doped structure is greater than a concentration of the dopant in the first doped structure, and the dopant comprises C or Be.

8. The semiconductor device structure as claimed in claim 1, wherein an upper portion of the second doped structure comprises a third dopant, and the third dopant comprises Al, Zn, Cd, or Co.

9. The semiconductor device structure as claimed in claim 1, wherein an upper portion of the second doped structure comprises a third dopant, and the third dopant comprises Be, C, or Zn.

10. The semiconductor device structure as claimed in claim 1, further comprising:
a conductive contact over the first doped structure; and
a contact metal layer between the conductive contact and the first doped structure, wherein the contact metal layer comprises a refractory metal material.

11. A semiconductor device structure, comprising:
a semiconductor substrate;
a first gate stack and a second gate stack over the semiconductor substrate;
an n-type doped structure over the semiconductor substrate and adjacent to the first gate stack, wherein the n-type doped structure comprises a III-V compound semiconductor material and a dopant; and
a p-type doped structure over the semiconductor substrate and adjacent to the second gate stack, wherein the p-type doped structure comprises the III-V compound semiconductor material and the dopant, and a concentration of the dopant in the p-type doped structure is greater than a concentration of the dopant in the n-type doped structure.

12. The semiconductor device structure as claimed in claim 11, wherein the dopant comprises Si, Ge, Sn, or Pb.

13. The semiconductor device structure as claimed in claim 11, further comprising:
a dielectric layer over the n-type doped structure and the p-type doped structure; and
a conductive contact in the dielectric layer and in electrical contact with the p-type doped structure.

14. The semiconductor device structure as claimed in claim 13, further comprising a contact element between the p-type doped structure and the conductive contact, wherein the contact element comprises Nb, Mo, Ta, W, Rh, or a combination thereof.

15. The semiconductor device structure as claimed in claim 14, wherein an upper portion of the p-type doped structure comprises a second dopant, and the second dopant comprises Al, Zn, Cd, Co, or a combination thereof.

16. A method for forming a semiconductor device structure, comprising:
forming a first gate stack and a second gate stack over a semiconductor substrate;
forming a first recess and a second recess in the semiconductor substrate, wherein the first recess is adjacent to the first gate stack, and the second recess is adjacent to the second gate stack;
forming a III-V compound semiconductor material in the first recess and the second recess to form a first doped structure in the first recess and a second doped structure in the second recess, wherein the III-V compound semiconductor material comprises a dopant; and
doping the second doped structure with a second dopant such that the first doped structure and the second doped structure have different conductivity types.

17. The method for forming a semiconductor device structure as claimed in claim 16, wherein the dopant and the second dopant are the same.

18. The method for forming a semiconductor device structure as claimed in claim 16, further comprising forming a mask layer to cover the first doped structure before the second doped structure is doped with the second dopant.

19. The method for forming a semiconductor device structure as claimed in claim 18, further comprising doping an upper portion of the second doped structure with a third dopant, wherein the third dopant comprises Al, Zn, Cd, Co, Be, C, or Zn.

20. The method for forming a semiconductor device structure as claimed in claim 18, further comprising:
forming a dielectric layer over the second doped structure;
forming a contact opening in the dielectric layer;
forming a contact element in the contact opening and over the second doped structure, wherein the contact element comprises a refractory metal material; and
forming a conductive contact in the contact opening and over the contact element.

* * * * *